(12) United States Patent
Bower et al.

(10) Patent No.: US 11,495,561 B2
(45) Date of Patent: Nov. 8, 2022

(54) MULTILAYER ELECTRICAL CONDUCTORS FOR TRANSFER PRINTING

(71) Applicant: X Display Company Technology Limited, Dublin (IE)

(72) Inventors: Christopher Andrew Bower, Raleigh, NC (US); Matthew Alexander Meitl, Durham, NC (US)

(73) Assignee: X Display Company Technology Limited, Dublin (IE)

( * ) Notice: Subject to any disclaimer, the term of this patent is extended or adjusted under 35 U.S.C. 154(b) by 113 days.

(21) Appl. No.: 16/872,335

(22) Filed: May 11, 2020

(65) Prior Publication Data

US 2021/0351146 A1 Nov. 11, 2021

(51) Int. Cl.
*H01L 21/00* (2006.01)
*H01L 23/00* (2006.01)
*H01L 21/56* (2006.01)

(52) U.S. Cl.
CPC .......... *H01L 24/11* (2013.01); *H01L 21/563* (2013.01); *H01L 24/14* (2013.01); *H01L 24/95* (2013.01); *H01L 2224/1144* (2013.01); *H01L 2224/1403* (2013.01); *H01L 2924/14* (2013.01)

(58) Field of Classification Search
CPC ....... H01L 24/11; H01L 21/563; H01L 24/14; H01L 24/95; H01L 2224/1144; H01L 2224/1403; H01L 2924/14
See application file for complete search history.

(56) References Cited

U.S. PATENT DOCUMENTS

| | | | | |
|---|---|---|---|---|
| 5,591,480 A | * | 1/1997 | Weisman | H03H 3/08 |
| | | | | 216/13 |
| 6,242,761 B1 | * | 6/2001 | Fujimoto | H01L 33/145 |
| | | | | 257/618 |
| 6,246,507 B1 | * | 6/2001 | Bauer | B60R 1/088 |
| | | | | 359/267 |
| 7,622,367 B1 | | 11/2009 | Nuzzo et al. | |
| 7,943,491 B2 | | 5/2011 | Nuzzo et al. | |

(Continued)

OTHER PUBLICATIONS

Cok, R. S. et al., 60.3: AMOLED Displays Using Transfer-Printed Integrated Circuits, Society for Information Display, 10:902-904, (2010).

*Primary Examiner* — Nicholas J Tobergte

(74) *Attorney, Agent, or Firm* — Choate, Hall & Stewart LLP; Michael D. Schmitt

(57) ABSTRACT

An electrical conductor structure comprises a substrate and an electrical conductor disposed on or in the substrate. The electrical conductor comprises a first layer and a second layer disposed on a side of the first layer opposite the substrate. The first layer comprises a first electrical conductor that forms a non-conductive layer on a surface of the first electrical conductor when exposed to air and the second layer comprising a second electrical conductor that does not form a non-conductive layer on a surface of the second electrical conductor when exposed to air. A component comprises a connection post that is electrically connected to the second layer and the electrical conductor. The first and second layers can be inorganic. The first layer can comprise a metal such as aluminum and the second layer can comprise an electrically conductive metal oxide such as indium tin oxide.

15 Claims, 10 Drawing Sheets

(56) References Cited

U.S. PATENT DOCUMENTS

| | | |
|---|---|---|
| 8,039,847 B2 | 10/2011 | Nuzzo et al. |
| 8,722,458 B2 | 5/2014 | Rogers et al. |
| 8,889,485 B2 | 11/2014 | Bower |
| 9,161,448 B2 | 10/2015 | Menard et al. |
| 10,468,363 B2 | 11/2019 | Prevatte et al. |
| 10,833,225 B2 * | 11/2020 | Bower ................... G02F 1/167 |
| 10,985,143 B2 * | 4/2021 | Bower ................. H05K 1/0306 |
| 2007/0194460 A1 * | 8/2007 | Lee ......................... H01L 24/05 257/781 |
| 2009/0133916 A1 * | 5/2009 | Grespan ................. H05K 1/147 156/60 |
| 2009/0224256 A1 * | 9/2009 | Shin ..................... H01L 29/458 257/40 |
| 2010/0155941 A1 * | 6/2010 | Matsuki ................. H01L 24/12 257/737 |
| 2012/0326131 A1 * | 12/2012 | Han .................... H01L 51/5215 257/E27.118 |
| 2014/0252604 A1 * | 9/2014 | Motoyoshi ......... H01L 25/0657 257/676 |
| 2017/0047303 A1 * | 2/2017 | Meitl ..................... H01L 24/14 |
| 2018/0358574 A1 * | 12/2018 | Musa .................... H01L 51/441 |
| 2019/0088630 A1 * | 3/2019 | Cok ........................ H01L 33/62 |
| 2019/0369765 A1 * | 12/2019 | Pai ........................ G06F 3/0446 |

* cited by examiner

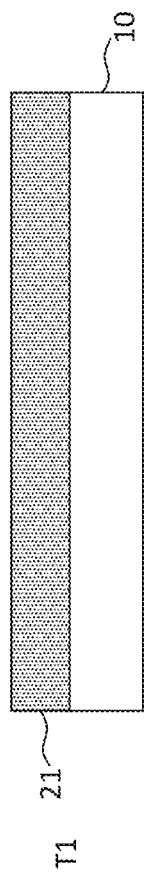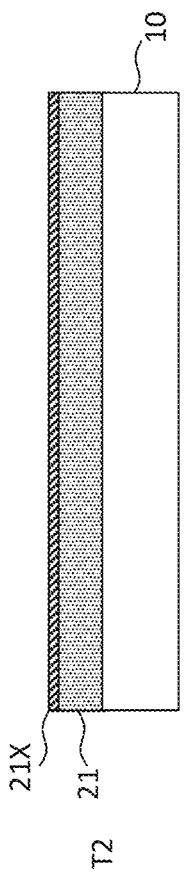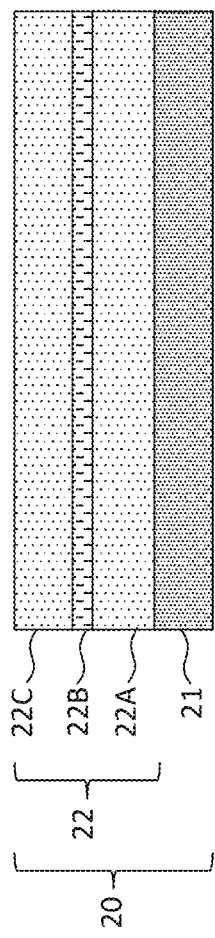

MULTILAYER ELECTRICAL CONDUCTORS FOR TRANSFER PRINTING

CROSS REFERENCE TO RELATED APPLICATION

Reference is made to U.S. Pat. No. 8,889,485, entitled Methods for Surface Attachment of Flipped Active Components by Christopher Bower and U.S. Pat. No. 10,468,363, entitled Chiplets with Connection Posts by Prevatte et al, the disclosures of which are incorporated herein by reference in their entirety.

TECHNICAL FIELD

The present disclosure relates to structures and methods for electrically interconnecting non-native components to backplane contact pads, for example using micro-transfer printing.

BACKGROUND

Substrates with electronically active components distributed over the extent of the substrate are used in a variety of electronic systems, for example, in flat-panel display components such as flat-panel liquid crystal or organic light emitting diode (OLED) displays, in imaging sensors, and in flat-panel solar cells. The electronically active components are typically either assembled on the substrate, for example using individually packaged surface-mount integrated-circuit components and pick-and-place tools, or by coating a layer of semiconductor material on the substrate and then photolithographically processing the semiconductor material to form thin-film circuits on the substrate. Individually packaged integrated-circuit components typically have smaller transistors with higher performance than thin-film circuits but the packages are larger than can be desired for highly integrated systems.

Methods for transferring small, active components from one substrate to another are described in U.S. Pat. Nos. 7,943,491, 8,039,847, and 7,622,367. In these approaches, small integrated circuits are formed on a native semiconductor source wafer. The small, unpackaged integrated circuits, or chiplets, are released from the native source wafer by pattern-wise etching portions of a sacrificial layer located beneath the chiplets, leaving each chiplet suspended over an etched sacrificial layer portion by a tether physically connecting the chiplet to an anchor separating the etched sacrificial layer portions. A viscoelastic elastomer stamp is pressed against the process side of the chiplets on the native source wafer, adhering each chiplet to an individual stamp post. The stamp with the adhered chiplets is removed from the native source wafer and the chiplets on the stamp posts are then pressed against a non-native target substrate with the stamp and adhered to the target substrate.

In another example, U.S. Pat. No. 8,722,458 entitled Optical Systems Fabricated by Printing-Based Assembly teaches transferring light-emitting, light-sensing, or light-collecting semiconductor elements from a wafer substrate to a target substrate or backplane. Such micro-transferred components provide the high performance of crystalline semiconductor components together with the small size of unpackaged dies.

In such methods it is generally necessary to electrically connect the small integrated circuits or chiplets to electrically conductive elements such as backplane contact pads on the target substrate. By applying electrical signals to conductors on the target substrate the small integrated circuits are energized and made operational.

Electrical connections between small integrated circuits and backplane contact pads are typically made by photolithographic processes in which a metal is evaporated or sputtered onto the small integrated circuits and the target substrate to form a metal layer, the metal layer is coated with a photoresist that is exposed to a circuit connection pattern, and the metal layer and photoresist are developed by etching and washing to form the patterned electrical connections between the small integrated circuits and the contact pads on the target substrate. Additional layers, such as interlayer dielectric insulators can also be required. This process is expensive and requires a number of manufacturing steps. Moreover, the topographical structure of the small integrated circuits over the target substrate renders the electrical connections problematic. For example, it can be difficult to form a continuous conductor from the target substrate to the small integrated circuit because of the topographical differences in height over the surface between the small integrated circuits and the target substrate.

U.S. Pat. No. 10,468,363, entitled Chiplets with Connection Posts discloses methods in which connection posts on each chiplet are electrically connected to contact pads on the target substrate, for example by micro-transfer printing. The connection posts are electrically connected to a circuit in each chiplet and can have a sharp point that pierces the contact pad to form an electrical connection between the circuit and the contact pad so that no further material (e.g., metal electrode) deposition and patterning is necessary, reducing the cost of processing.

There is a need, therefore, for structures and methods that enable the electrical interconnection of small integrated circuits, such as micro transfer printed chiplets, to target substrates.

SUMMARY

In accordance with some embodiments of the present disclosure, components such as chiplets incorporating active elements such as transistors or passive elements such as resistors, capacitors, and conductors, or both, are micro transfer printed from a native component source wafer to a non-native target substrate or backplane. The components include an electrically conducting connection post that protrudes from a component surface or substrate and is brought into contact with a target or destination substrate contact pad to form an electrical connection between the component and the target substrate. The components can be at least partially adhered to the target substrate by forcefully driving the connection posts into the target substrate contact pads when micro transfer printing, for example by exerting mechanical pressure on the transfer stamp. The connection posts, the target substrate contact pads, or both the connection posts and the target substrate contact pads can be deformed or crumpled and the connection post can be driven into or through the target substrate contact pad, thereby wedging the connection post in the target substrate contact pad to adhere the connection post to the target substrate contact pad and form an electrical connection between them. As a consequence, the connection post can be welded to the target substrate contact pad. An additional heat treatment can be provided to facilitate the welding.

According to some embodiments of the present disclosure, an electrical conductor structure comprises a substrate, an electrical conductor disposed on or in the substrate, wherein the electrical conductor comprises a first layer and a second layer. The second layer is disposed on a side of the first layer opposite the substrate. The first layer comprises a first electrical conductor that forms a non-conductive layer on a surface of the first electrical conductor when exposed to air (e.g., in the ambient environment) and the second layer comprises a second electrical conductor that does not form a non-conductive layer on a surface of the second electrical conductor when exposed to air (e.g., in the ambient environment). A component is electrically connected to the second layer and the component comprises a connection post electrically connected to the electrical conductor. According to some embodiments, the second layer covers the first layer, covers the top of the first layer, or covers the top and sides of the first layer. The electrical conductor can be a wire, a trace, or a contact pad.

In some embodiments of the present disclosure, the component is a first component, the electrical conductor structure comprises a second component electrically connected to the electrical conductor structure. The first and second components can be integrated circuits comprising an inorganic, crystalline substrate. The electrical conductor can conduct electrical current from the first component to the second component.

In some embodiments, the connection post is electrically connected to the second layer, is electrically connected to the first layer, or is electrically connected to the second layer and the first layer. In some embodiments, the electrical conductor is not transparent, is light-absorbing, or both. The component can comprise a broken (e.g., fractured) or separated tether. The connection post can have a sharp point that contacts and extends into the second layer or that contacts and extends into the second layer and the first layer.

In some embodiments, the component is electrically connected to the second layer with an electrode. The first layer can comprise a metal, for example aluminum, copper, or silver [e.g., having a purity of at least 90 atom % (e.g., at least 95 atom % or at least 99 atom %)], and the second layer can comprise a metal oxide, for example indium tin oxide (ITO), aluminum zinc oxide (AZO), or chromium oxide.

In some embodiments, the second layer can comprise multiple sublayers, for example the second layer can comprise a first sublayer of ITO, a second sublayer of black chromium oxide or carbon black on the first sublayer, and a third sublayer of ITO on the second sublayer.

In some embodiments, the first layer has an electrical conductivity that is at least 5× (e.g., at least 7× or at least 10×) an electrical conductivity of the second layer. In some embodiments, the connection post is physically in contact with only the second layer of the electrical conductor. In some embodiments, the connection post is physically in contact with both the second layer and the first layer of the electrical conductor. In some embodiments, the first layer is at least 1.5× (e.g., at least 2×, 3×, 4×, 5×, or 10×) as thick as the second layer.

According to embodiments of the present disclosure, a method of making an electrical conductor structure comprises providing a substrate, disposing a first layer of electrically conductive material on or in the substrate, wherein the first layer comprises a first electrical conductor that forms a non-conductive layer on a surface of the first electrical conductor when exposed to air, patterning the first layer, disposing a second layer of electrically conductive material at least partially on the first layer, wherein the second layer comprises a second electrical conductor that does not form a non-conductive layer on a surface of the second electrical conductor when exposed to air, patterning the second layer, providing a component physically connected to a component source wafer with a tether, and micro-transfer printing the component from the component source wafer to the substrate, thereby breaking (e.g., fracturing) or separating the tether and electrically connecting the component to the second layer. In some embodiments, methods of the present disclosure comprise patterning the first layer and patterning the second layer in a common step.

In some embodiments, methods of the present disclosure comprise disposing sublayers of different materials on the first layer to form the second layer.

In some embodiments, methods of the present disclosure comprise connecting the component to the second layer with an electrode. In some embodiments, micro-transfer printing the component comprises pressing the connection post onto or into the second layer and electrically connecting the connection post to the second layer. The connection post can have a sharp point.

In one aspect, the disclosure is directed to a printable component comprising a micro-integrated circuit or chiplet having a component substrate separate and distinct from the substrate (target substrate or destination substrate) and one or more electrically conductive connection posts protruding from the component substrate. Printable components can be micro-transfer printable components physically connected to a source wafer anchor with a tether and transferable from the source wafer to a target substrate with a stamp. The component substrate can be a semiconductor substrate.

In certain embodiments, the printable component is an active component having an active element, a passive component having a passive element, or a compound structure having a plurality of active elements, passive elements, or a combination of active and passive elements. Components, component substrates, chiplets, or chiplet substrates can comprise a broken (e.g., fractured) or separated tether as a consequence of micro-transfer printing the component or chiplet from a source wafer to the substrate (destination substrate or target substrate). In certain embodiments, the printable component is a micro-component and has at least one of a width, length, and height from 2 to 5 µm, 5 to 10 µm, 10 to 20 µm, or 20 to 50 µm. In certain embodiments, the printable component is or comprises a light-emitting diode, photo-diode, or transistor.

In another aspect, the printable component comprises a dielectric layer having connection posts protruding from the dielectric layer and a micro-component or chiplet. The dielectric layer can be a substrate. The micro-component can have a semiconductor substrate and component contact pads and can be disposed on the dielectric layer. Electrical conductors (e.g., electrodes) can electrical connect the connection posts to the component contact pads. In certain embodiments, the component contact pads are located on a same side of the micro-component adjacent to the connection posts. In certain embodiments, the printable component includes a patterned electrical connection layer between the connection posts and the micro-component contact pads. In certain embodiments, the micro-component contact pads are located on a side of the chiplet opposite the connection posts.

In some embodiments, the disclosure is directed to a printed structure comprising a target substrate and one or more printed components. Printed components can be printable components micro-transfer printed from a source wafer to a target substrate with a stamp and can comprise a broken (e.g., fractured) or separated tether. The target substrate has two or more electrical contacts (e.g., contact pads) and each connection post is in contact with, extends into, or extends through an electrical contact of the target substrate to electrically connect the electrical contacts to the connection posts. In certain embodiments, the target substrate is a member selected from the group consisting of polymer, plastic, resin, polyimide, PEN, PET, metal, metal foil, glass, a semiconductor, crystalline silicon, and sapphire. In certain embodiments, the target substrate has a thickness from 5 to 10 microns, 10 to 50 microns, 50 to 100 microns, 100 to 200 microns, 200 to 500 microns, 500 microns to 0.5 mm, 0.5 to 1 mm, 1 mm to 5 mm, 5 mm to 10 mm, or 10 mm to 20 mm. The target substrate can also be referred to as a destination substrate or simply a substrate, but is distinct from and independent of the components, component substrates, chiplets, chiplet substrates, or component dielectric layers.

In some embodiments, an adhesive material is located within a volume between the connection posts of a printed component. In certain embodiments, the adhesive material can underfill the volume and applies compression between the printed component and the target substrate.

According to some embodiments of the present disclosure, an electrical conductor comprises a first layer and a second layer. The first layer comprises a metallic conductor and the second layer comprises three sublayers, a first sublayer, a second sublayer, and a third sublayer. The first sublayer comprises ITO disposed on the first layer. The second sublayer comprises chromium disposed on the first sublayer. The third sublayer comprises ITO disposed on the second sublayer. According to some embodiments, the metallic conductor is aluminum. When incorporating sublayers, the electrical conductor can be considered to be a four-layer electrical conductor. In some embodiments, the electrical conductor comprises a substrate, for example glass or plastic, forming an electrical conductor structure. The first layer can be disposed on the substrate or the second layer can be disposed on the substrate.

According to some embodiments, the first sublayer and the second sublayer have substantially the same thickness. In some embodiments, the first or third sublayers are five to twenty times thicker than the second sublayer. For example, the first and third sublayers can be 40 nm thick and the second sublayer can be five nm thick. The first layer can be thicker than the first or third sublayer and can be as thick as, or thicker than, the second layer.

According to some embodiments of the present disclosure, the electrical conductor forms or is an electrically conductive light trap. The electrical conductor comprises a first electrically conductive layer comprising a first electrically conductive material and a second electrically conductive layer comprising one or more second electrically conductive material(s) disposed on and in contact with the first layer. The first electrically conductive material can be a metal, for example aluminum. The second electrically conductive materials can comprise multiple layers, for example three layers comprising a layer of chromium disposed between layers of ITO. In some embodiments, the electrical conductor with sublayers is a four-layer electrical conductor.

In one aspect, the present disclosure is directed to an electrically conductive light trap. The light trap can include an electrical conductor including a first electrically conductive layer including a first electrically conductive material and a second electrically conductive layer including a second electrically conductive material different from the first electrically conductive material. The second electrically conductive material can be disposed on and in contact with the first layer. The electrical conductor can be constructed to absorb at least 50% (e.g., at least 70% or at least 90%) of incident visible light. In some embodiments, the first electrically conductive material is a metal having a purity of at least 90 atom % and the second electrically conductive material is an electrically conductive oxide.

In one aspect, the present disclosure is directed to an electrical conductor including a first layer and a second layer. The first layer can include a metallic conductor. The second layer can include three sublayers, for example a first sublayer including indium tin oxide (ITO) disposed on the first layer, a second sublayer including chromium disposed on the first sublayer, and a third sublayer including ITO disposed on the second sublayer such that the second sublayer is disposed between the first sublayer and the third sublayer.

In some embodiments, the metallic conductor is aluminum having a purity of at least 90%. In some embodiments, a substrate and wherein the first sublayer is disposed on the substrate or wherein the second sublayer is disposed on the substrate. In some embodiments, the first sublayer and the third sublayer have substantially the same thickness. In some embodiments, at least one of the first sublayer and the third sublayer is five to twenty times thicker than the second sublayer.

In one aspect, the present disclosure is directed to an electrically conductive light trap that includes an electrical conductor including a first electrically conductive layer including a first electrically conductive material and a second electrically conductive layer including one or more sublayers of electrically conductive material(s) disposed on and in contact with the first layer, wherein the electrical conductor is constructed to absorb 50% or more of incident visible light. In some embodiments, the first electrically conductive material is a metal having a purity of at least 90 atom % and the one or more sublayers comprises one or more electrically conductive oxide layers.

In one aspect, the present disclosure is directed to an electrical conductor structure including a substrate and an electrical conductor disposed on or in the substrate. The electrical conductor can include a first layer and a second layer disposed on a side of the first layer opposite the substrate, the first layer including a metal and the second layer including electrically conductive oxide. The electrical conductor structure can include a component physically connected to the second layer, wherein the component comprises a connection post electrically connected to the electrical conductor.

In some embodiments, the metal is selected from the group consisting of aluminum, silver, and copper, the metal having a purity of at least 90 atom % (e.g., at least 95 atom % or at least 99 atom %). In some embodiments, the electrically conductive oxide is an electrically conductive metal oxide selected from the group consisting of indium tin oxide (ITO), aluminum zinc oxide (AZO), and chromium oxide.

In one aspect, the present disclosure is directed to an electrical conductor structure including an electrical conductor disposed on or in a substrate. The electrical conductor can include an opaque material having a transparency to visible light of less than 50% disposed between layers of electrically conductive metal oxide. In some embodiments, each of the layers of electrical conductive metal oxide is, independently, an indium tin oxide (ITO) or aluminum zinc oxide (AZO) layer. In some embodiments, the opaque material is electrically conductive. In some embodiments, the opaque material comprises black chromium oxide or carbon black. In some embodiments, the layers of electrically conductive metal oxide are each five to twenty times thicker than the opaque material. In some embodiments, the electrical conductor structure includes a component comprising a connection post, wherein the connection post is in physical and electrical contact with one or more of the layers of electrically conductive metal oxide.

The present disclosure provides structures and methods that enable the construction of electrical interconnections between small integrated circuits that are transfer printed on a target substrate. The electrical interconnection process is simple and inexpensive requiring fewer process steps than known alternative methods and provides a superior electrical connection in micro-transfer printing processes using electrically conductive materials compatible with common photolithographic processes.

BRIEF DESCRIPTION OF THE DRAWINGS

The foregoing and other objects, aspects, features, and advantages of the present disclosure will become more apparent and better understood by referring to the following description taken in conjunction with the accompanying drawings, in which:

FIGS. 5 and 6 are sequential cross sections illustrating the development of an electrically non-conductive surface layer on a conductor useful in understanding illustrative embodiments of the present disclosure;

FIG. 7 is a cross section of an electrical conductor with sublayers according to illustrative embodiments of the present disclosure;

Figure 1A:
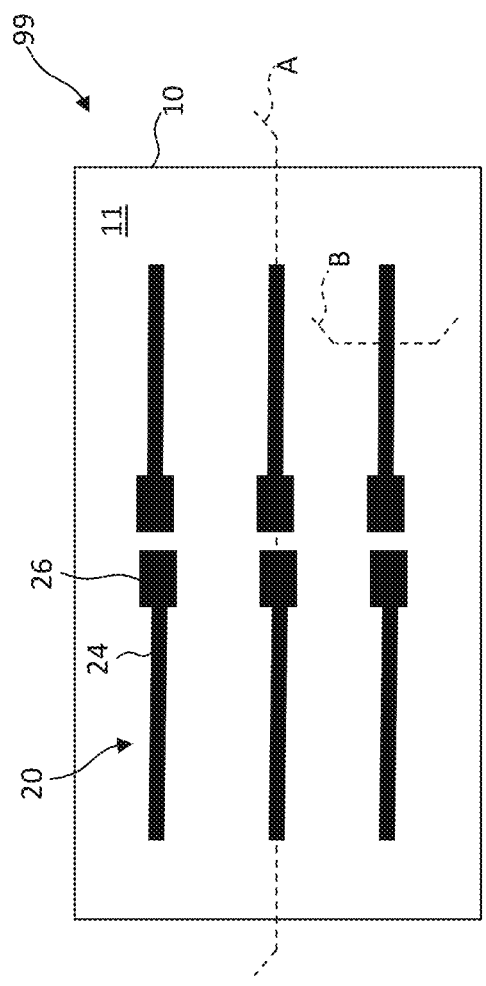
FIG. 1A is a plan view of an electrical conductor structure according to illustrative embodiments of the present disclosure.

Features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

DETAILED DESCRIPTION OF CERTAIN EMBODIMENTS

The present disclosure provides a structure and method for electrically connecting relatively small electrical components such as integrated circuit chiplets from a component source wafer to a relatively large target substrate in an efficient and effective way with reduced costs. The target substrate can have electrical conductors (e.g., contact pads) and the small electrical components can comprise electrically conductive connection posts. The components can be transferred from the component source wafer to the electrical conductors of the target substrate so that the connection posts are electrically connected to the contact pads by micro-transfer printing. Embodiments of the present disclosure provide structures and methods having improved electrical connections between connection posts of small micro-transfer-printed electrical components and target substrate electrical conductors.

Figure 1B:
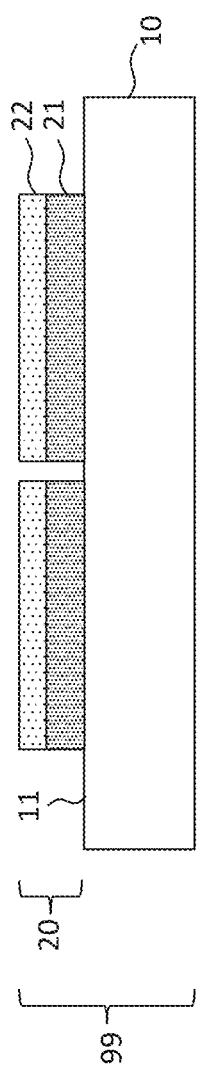
FIG. 1B is a cross section of FIG. 1A taken across cross section line A according to illustrative embodiments of the present disclosure.
Figure 2A:
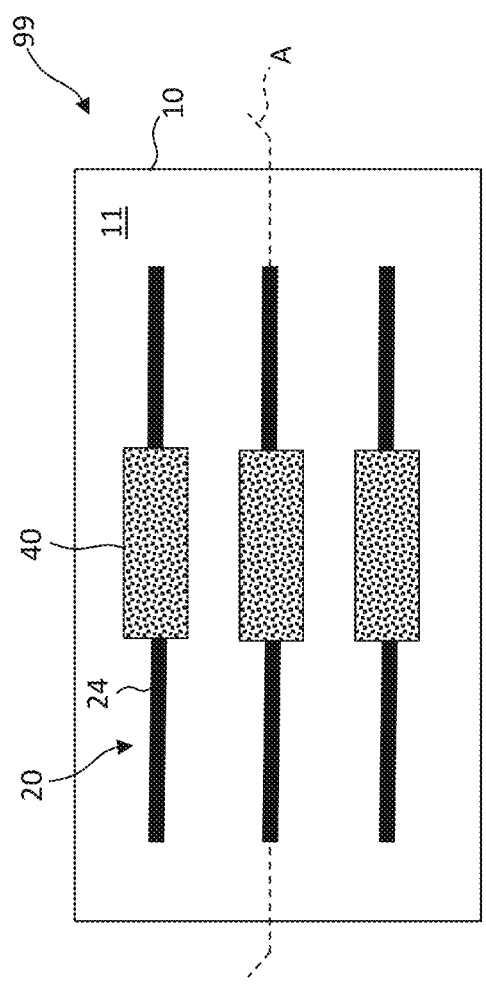
FIG. 2A is a plan view of an electrical conductor structure according to illustrative embodiments of the present disclosure comprising a component.
Figure 2B:
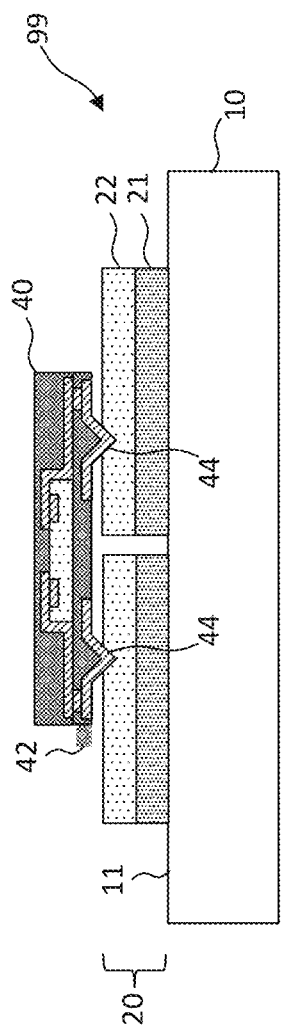
FIG. 2B is a cross section of FIG. 2A taken across cross section line A according to illustrative embodiments of the present disclosure.

According to some embodiments of the present disclosure, and as illustrated in the plan view of FIGS. 1A and 2A and the corresponding cross sections of FIGS. 1B and 2B taken across cross section line A, electrical connection between a component connection post 44 and a substrate contact pad 26 can have improved performance with the use of an electrical conductor structure 99 comprising a substrate 10 and a patterned bilayer electrical conductor 20 disposed on or in a surface 11 of substrate 10. Bilayer electrical conductor 20 can be disposed in a pattern to conduct electrical current over surface 11 of substrate 10 to electrically connect devices or components 40 disposed on surface 11 of substrate 10. Bilayer electrical conductor 20 can be portions of or all of a wire 24 or a trace disposed or formed on a printed circuit board or other substrate (e.g., substrate 10), for example a display substrate, intended to conduct electrical current. Bilayer electrical conductor 20 can be a substrate contact pad 26 onto or into which connection posts 44 of components 40 (shown in FIG. 2B) are micro-transfer printed.

Figure 2C:
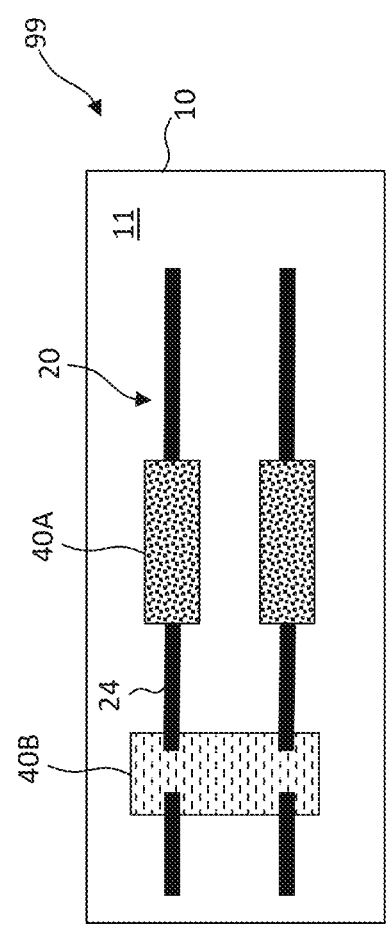
FIG. 2C is a plan view of an electrical conductor structure according to illustrative embodiments of the present disclosure.

According to some embodiments, electrical conductor 20 comprises a patterned electrically conductive first layer 21 and a patterned electrically conductive second layer 22 disposed at least partially on a side of first layer 21 opposite substrate 10. First layer 21 comprises a first electrical conductor that forms a non-conductive layer on a surface of the first electrical conductor when exposed to air (e.g., in the ambient environment) and second layer 22 comprising a second electrical conductor that does not form a non-conductive layer (e.g., native oxide) on a surface of the second electrical conductor when exposed to air (e.g., in the ambient environment). First layer 21 is electrically connected to second layer 22. Patterned bilayer electrical conductor 20 can form wires 24 or contact pads 26 to which electrical devices can be electrically connected, for example electrically connecting a first integrated circuit (component 40A) to a second, different integrated circuit (component 40B), where each of first and second integrated circuits 40A, 40B have a semiconductor substrate, for example a crystalline inorganic substrate such as crystalline silicon, that is separate and independent of substrate 10 on, over, or in which patterned bilayer electrical conductor 20 is formed, as shown in FIG. 2C. Patterned bilayer electrical conductor 20 can conduct electrical current from first integrated circuits 40A to second integrated circuits 40B. First and second layers 21, 22 can both comprise inorganic materials or be inorganic. Thus, in some embodiments of the present disclosure, component 40 is a first component 40A and bilayer electrical conductor structure 99 comprises a second component 40B electrically connected to bilayer electrical conductor 20. First and second components 40A, 40B can be integrated circuits comprising an inorganic, crystalline substrate separate and independent of substrate 10. Bilayer electrical conductor 20 can conduct electrical current from first component 40A to second component 40B, or vice versa.

First and second layers 21, 22 of bilayer electrical conductor 20 and wires 24 and contact pads 26 can be constructed using photolithographic methods and materials, e.g., evaporation or sputtering deposition, patterning using photoresists, patterned exposure through masks, and etchants. Bilayer electrical conductor 20 can have a resistivity of less than 10E-8 ohm-meters, 5E-8 ohm-meters, 3E-8 ohm-meters or less, or 2E-8 ohm-meters or less.

Figure 1C:
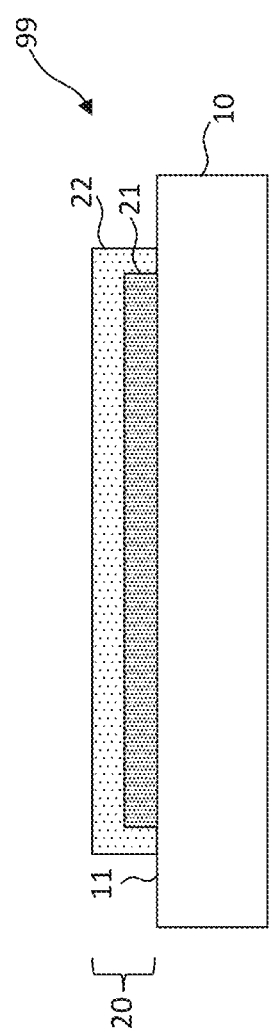
FIG. 1C is a cross section of FIG. 1A taken across cross section line B according to illustrative embodiments of the present disclosure.

According to some embodiments of the present disclosure and as illustrated in the cross section of FIG. 1C, second layer 22 can cover first layer 21, so that first layer 21 is not exposed to air even if second layer 22 is exposed to air. For example, second layer 22 can cover surfaces of first layer 21 that are substantially parallel (e.g., to within 10 or 5 degrees) to surface 11 of substrate 10 and surfaces that are not substantially parallel, for example surfaces that are substantially orthogonal to surface 11. In some embodiments, second layer 22 covers at least a portion or all of top side of first layer 21 opposite substrate 10. The top side of first layer 21 can be or comprise an electrical contact surface. Second layer 22 can be disposed on first layer 21 without exposing first layer 21 to ambient conditions (e.g., oxygen in air) or contaminants, for example using vacuum deposition and patterning processes, such as are commonly found in integrated circuit or display fabrication facilities.

According to some embodiments of the present disclosure, first layer 21 is not transparent (e.g., is less than 50% transparent to visible light, less than 30% transparent to visible light, less than 10% transparent to visible light, less than 5% transparent to visible light, or less than 2% transparent to visible light), second layer 22 is not transparent, first layer 21 and second layer 22 are both not transparent, or first layer 21 is not transparent and second layer 22 is transparent. Second layer 22 can be thinner than first layer 21 (e.g., as shown in FIGS. 1B and 1C). Second layer 22 can be less electrically conductive than first layer 21. First layer 21, second layer 22, or both first layer 21 and second layer 22 can be light absorbing or non-transmissive to visible light, for example more than 50%, 70%, 80%, 90% or 95% light absorbing or non-transmissive to visible light. In some embodiments, component 20 is non-transparent and contact pads 26 of bilayer electrical conductor 20 are disposed at least partially between component 20 and substrate 10, so that contact pads 26 are not readily visible to an observer, so that even if, for example, embodiments of the present disclosure are applied to desirably transparent systems, there is reduced or no benefit to substantially or partially transparent contact pads 26 of bilayer electrical conductor 20.

Figure 10:
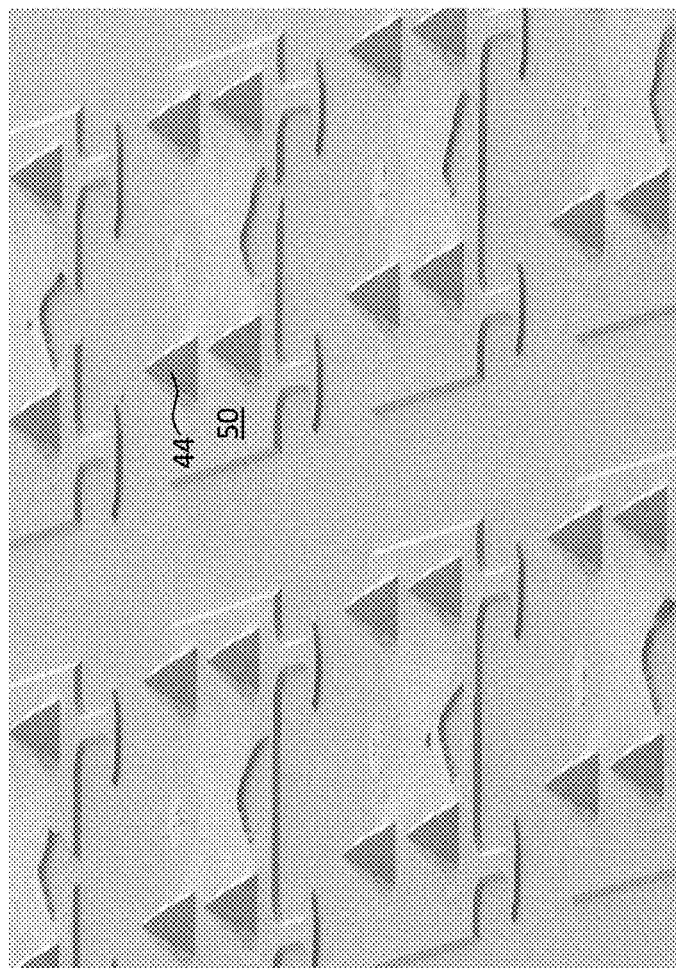
FIG. 10 is a micrograph of connection posts on a dielectric substrate according to illustrative embodiments of the present disclosure.

According to some embodiments of the present disclosure and as illustrated in the plan view of FIG. 2A and the corresponding cross section of FIG. 2B taken across cross section line A, bilayer electrical conductor structure 99 comprises a component 40 electrically connected to second layer 22. Component 40 can be micro-transfer printed from a component source wafer to substrate 10 with a stamp and can comprise a broken (e.g., fractured) or separated tether 42 physically connecting component 40 to an anchor portion of the component source wafer that is broken (e.g., fractured) when component 40 is removed from the component source wafer. Component 40 can comprise electrically conductive connection posts 44 that are pressed onto or into bilayer electrical conductor 20, for example into second layer 22 of bilayer electrical conductor 20, thereby electrically connecting component 40 to bilayer electrical conductor 20 through connection posts 44. Electrically conductive connection posts 44 are illustrated, as an example, in FIG. 10.

Figure 3:
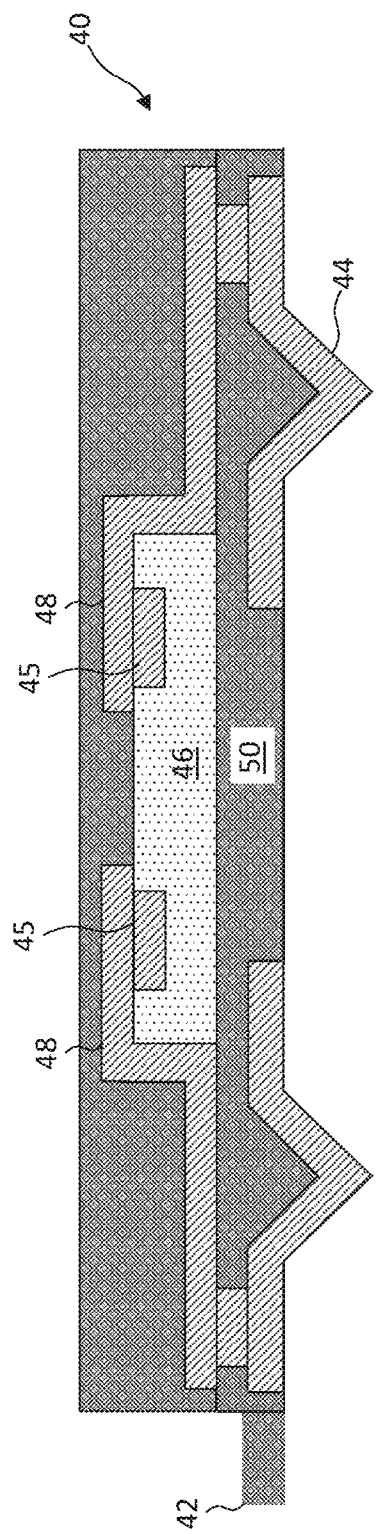
FIG. 3 is a cross section of a component useful in understanding illustrative embodiments of the present disclosure.
Figure 4:
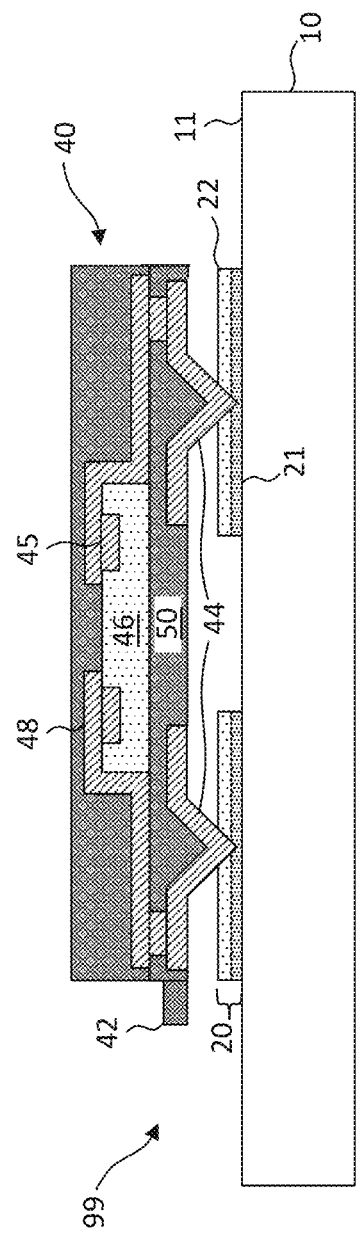
FIG. 4 is a cross section of an electrical conductor structure comprising a component according to illustrative embodiments of the present disclosure.

As shown in FIG. 4 and the detail of FIG. 3, component 40 can comprise a connection post 44 electrically connected to an integrated circuit 46 by electrodes 48 and to second layer 22. Connection posts 44 can have distal end that has a smaller area than a proximal end so that connection posts 44 can have a sharp point that contacts and extends into second layer 22. Second layer 22 can be thinner than first layer 21. According to some embodiments, connection post 44 can have a sharp point that contacts and extends into only second layer 22, as shown in FIG. 2B. According to some embodiments, connection post 44 can have a sharp point that contacts and extends into both second layer 22 and first layer 21, as shown in FIG. 4. In some such embodiments, the electrical connection between connection post 44 and bilayer electrical conductor 20 contact pad 26 is made as a consequence of the micro-transfer printing process and further photolithographic deposition and processing to form additional electrical conductors (wires) is not required.

In some embodiments of the present disclosure, a component 40 includes a plurality of electrical connections on a process side opposed to a back side of component 40. Each electrical connection can include an electrically conductive connection post 44 protruding from the process side. The electrical connection can also include a component contact pad 45 on which connection post 44 is disposed and to which connection post 44 is electrically connected, as shown in FIGS. 3 and 4.

Conventional processes for electrically connecting components disposed on a substrate to contact pads on the substrate use photolithographic methods and materials. Many of the materials used for electrically conductive wires are common metals, such as aluminum or copper, that oxidize in the presence of air to form non-conductive layers on the metal wires. As long as the substrate and metals are kept in a vacuum for photolithographic processing, the non-conductive layers do not form. However, if electrical connections are formed in the presence of air, the formation of non-conductive layers on the wires can inhibit the formation of electrical connections between components and contact pads disposed on the substrate. Printing processes, such as micro-transfer printing, are typically performed in air. Thus, electrical connection between components 40 with connection posts 44 that are micro-transfer printed onto contact pads 26 on a substrate 10 can be inhibited or entirely prevented by the presence of a layer of non-conductive material on the contact pads, since the connection posts 44 must be forced through the non-conductive layer to make electrical contact to the underlying conductive material. Non-conductive materials formed through exposure to ambient conditions (e.g., native oxides) can be hard, especially relative to the underlying electrically conductive material, which can make such forcing difficult. Thus, difficulty with forming electrical connections between contact pads and connection posts can be ameliorated or eliminated by using an electrical conductor that has an outer second layer that does not form a non-conductive material when exposed to ambient conditions (e.g., air).

For example, and as shown in FIG. 5, a conductor comprises an electrically conductive first layer 21 disposed on a substrate 10 at first time T1. After exposure to air or other gases or liquids, a non-conductive layer 21X (e.g., native oxide) forms on the surface of first layer 21 at second time T2 after first time T1, as shown in FIG. 6, inhibiting or preventing electrical connection to first layer 21. Contact pads comprising or coated with noble metals that resist oxidation, for example silver, platinum, and gold, can resist the formation of non-conductive surface layers (e.g., oxidation) but such noble metals are often difficult or expensive to employ in many fabrication processes, especially display manufacturing facilities. Indeed, some fabrication facilities refuse to use such materials for fear of process contamination.

In some embodiments, an electrical conductor includes a first layer 21 that is more electrically conductive than a second layer 22 that covers it, for example, has an electrical conductivity that is at least 5× (e.g., at least 7× or at least 10×) an electrical conductivity of second layer 22. For example, in some embodiments, an electrical conductor includes a second layer 22 that includes an electrically conductive oxide and a first layer 21 that includes a metal. The oxide can be, for example, ITO or AZO. The metal can be, for example, copper, tin, silver, or aluminum. In some embodiments, a connection post 44 is in physical contact with a first layer 21 and a lower conductivity second layer 22 on first layer 21 acts primarily to reduce non-conductive surface layer formation (e.g., non-conductive native oxide formation) as a highly conductive pathway exists directly from connection post 44 to first layer 21. In some embodiments, a connection post 44 is in physical contact only with second layer 22 and not a higher conductivity first layer 21 under second layer 22. Such a multilayer (e.g., bilayer) electrical conductor can still provide a benefit when used in an electrical conductor structure 99 because a conductive pathway can be primarily through higher conductivity first layer 21 with a short pathway bridging through second layer 22 from connection post 44 to first layer 21. It can thus be beneficial for first layer 21 to be substantially thicker than second layer 22, for example at least 1.5×, 2×, 3×, 4×, 5×, or 10× thicker. Such relative thickness can reduce conductivity through second layer 22 and increase conductivity through first layer 21 thereby increasing overall conduction even when connection post 44 is in physical contact with only second layer 22.

According to some embodiments of the present disclosure, by providing electrically conductive second layer 22 on and at least partially covering first layer 21, the formation of non-conductive layer 21X is substantially or effectively prevented, improving electrical connection to first layer 21. Second layer 22 can comprise a conductive metal oxide, such as indium tin oxide (ITO), aluminum zinc oxide (AZO), or chromium oxide. In some embodiments of the present disclosure, second layer 22 is or comprises indium tin oxide. Such an electrically conductive bilayer electrical conductor structure 99 is advantageous for interconnection processes that take place in ambient air conditions (e.g., atmospheric conditions) and that rely on micro-transfer printing processes to electrically connect a connection post 44 on a component 40 to a contact pad 26 on substrate 10.

In some embodiments of the present disclosure, first layer 21 comprises any electrically conductive material, for example some metals, that oxidizes when exposed to air or other gases, such as oxygen, and second layer and forms a non-conductive layer on the top of first layer 21 or in a layer on the top side of first layer 21. Second layer 22 can comprise any electrically conductive material that does not form a non-conductive layer on the top of second layer 22 or in a layer on the top side of second layer 22, for example metals that do not oxidize. First layer 21 can comprise a metal, for example aluminum, copper, tin, or silver. The metal can have a purity of at least 90 atom % (e.g., at least 95 atom % or at least 99 atom %). Second layer 22 can comprise an electrically conductive metal oxide, for example indium tin oxide (ITO), aluminum zinc oxide (AZO), chromium oxide, or a metal such as chromium or molybdenum. ITO is a well-known mixed oxide of indium and tin with a melting point in the range 1526-1926° C. (1800-2200 K. 2800-3500° F.), on, depending on composition.

According to some embodiments of the present disclosure, second layer 22 comprises multiple sublayers. Referring to FIG. 7, second layer 22 comprises multiple sublayers, for example first sublayer 22A disposed on first layer 21, second sublayer 22B disposed on first sublayer 22A, and third sublayer 22C disposed on second sublayer 22B such that second sublayer 22B is disposed between first sublayer 22A and third sublayer 22C. Such multiple sublayers can provide useful characteristics to second layer 22. For example, second layer 22 can comprise a first sublayer 22A of ITO, a second sublayer 22B of black chromium oxide or carbon black, and a third sublayer 22C of ITO. Such a multi-layer structure can absorb light and improve the contrast of bilayer electrical conductor structures 99 when applied to display applications. Since ITO is commonly transparent (e.g., 70% or more transparent to visibly light) and chromium oxide can be black, as can be electrically conductive carbon black, the multi-layer illustrated in FIG. 7 can appear black to a viewer of the electrical conductor structure 99.

In some embodiments of the present disclosure, first layer 21 can have a thickness of one micron or more, five microns or more, ten microns or more, twenty microns or more, fifty microns or more, or 100 microns or more. Second layer 22 can have a thickness of one nanometer or more, five nanometers or more, ten nanometers or more, twenty nanometers or more, fifty nanometers or more, 100 nanometers or more, one micron or more, five microns or more, ten microns or more, twenty microns or more, or fifty microns or more, or can be less than or equal to any of these amounts.

Figure 8:
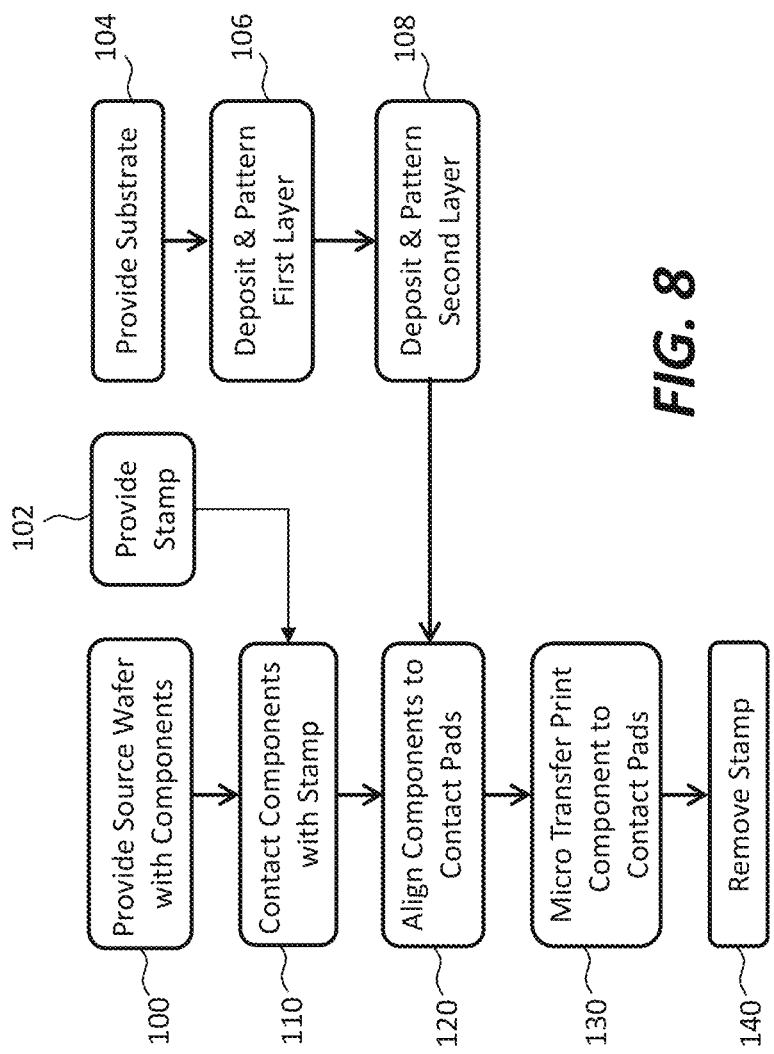
FIGS. 8 and 9 are flow charts illustrating methods of the present disclosure.

As illustrated in FIG. 8, some methods of making an electrical conductor structure 99 of the present disclosure comprise providing a component source wafer with components 40 in step 100, providing a stamp in step 102, and providing a substrate 10 in step 104 (e.g., a destination or target substrate). Components 40 can have electrically conductive connection posts 44. Substrate 10 can comprise substrate contact pads 26 disposed on surface 11 of substrate 10 or such contact pads 26 can be formed on surface 11 of substrate 10. In step 106, a first layer 21 of electrically conductive material is disposed and patterned on substrate 10. First layer 21 comprises a first electrical conductor that forms a non-conductive layer on a surface of the first electrical conductor when exposed to air or the ambient environment. In step 108, a second layer 22 of electrically conductive material is disposed and patterned on substrate 10. Second layer 22 comprises a second electrical conductor different from the first electrical conductor that does not form a non-conductive layer on a surface of the second electrical conductor when exposed to air or the ambient environment. Second layer 22 and first layer 21 can be separately patterned in different steps or can be patterned in a common step, for example after both first electrical conductor and second first electrical conductor are deposited. Second layer 22 and first layer 21 can be electrically connected.

In step 110, components 40 on the source wafer are contacted with the stamp, adhered to the stamp, transported to substrate 10 in alignment with contact pads 26 disposed on substrate 10 in step 120, and micro-transfer printed in step 130 onto substrate 10 so that connection posts 44 are in electrical contact with contact pads 26. In some embodiments, connection posts 44 have a sharp point that, as a consequence of micro-transfer printing, extend into or pierce second layer 22. In some embodiments, connection posts 44 extend through second layer 22 and extend into or pierce first layer 21. In step 140, the stamp is removed to form bilayer electrical conductor structure 99.

Figure 9:
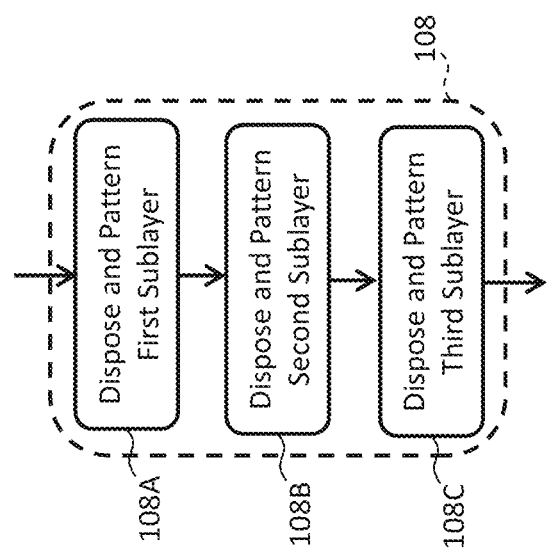

In some embodiments, second layer 22 is formed (step 108) in different steps by disposing sub layers of different materials on first layer 21 to form second layer 22. As shown in FIG. 7 and FIG. 9, first sublayer 22A is disposed and patterned in step 108A, second sublayer 22B is disposed and patterned in step 108B, and third sublayer 22C is disposed and patterned in step 108C. In some embodiments, any two or more or all of the sublayers 22A, 22B, 22C are patterned in a common step.

Printable component 40 can comprise a dielectric layer 50 having connection posts 44 protruding from dielectric layer 50 and a micro-component 40 (e.g., chiplet). Dielectric layer 50 can be a substrate. Micro-component 40 can have a semiconductor substrate and component contact pads 45 and can be disposed on dielectric layer 50 or integrated circuit 46. Electrical conductors (e.g., electrodes 48) can electrical connect connection posts 44 to component contact pads 45. In certain embodiments, component contact pads 45 are located on a same side of micro-component 40 adjacent to connection posts 44. In certain embodiments, printable component 40 includes a patterned electrical connection layer between connection posts 44 and micro-component contact pads 45. In certain embodiments, micro-component contact pads 45 are located on a side of chiplet 40 opposite connection posts 44.

Figure 11A:
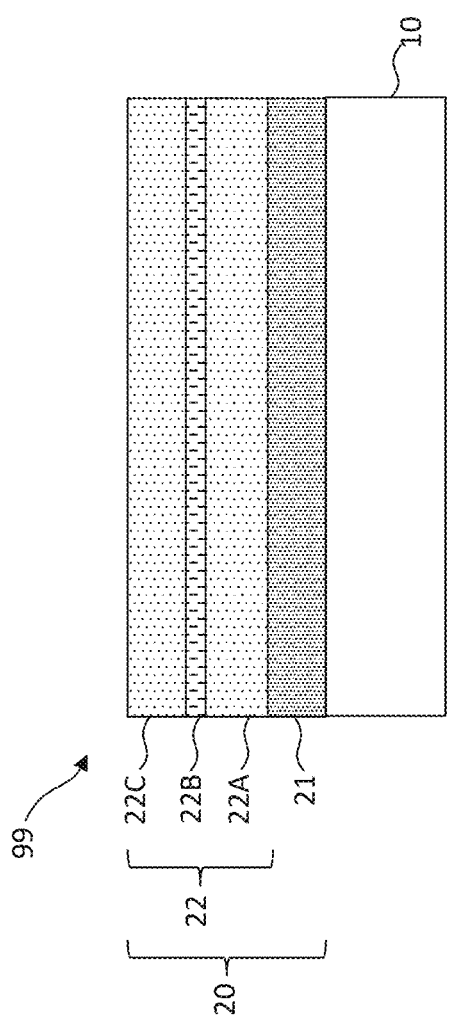
FIGS. 11A and 11B are schematic cross sections of a bilayer electrical conductor structure and a substrate according to illustrative embodiments of the present disclosure.
Figure 11B:
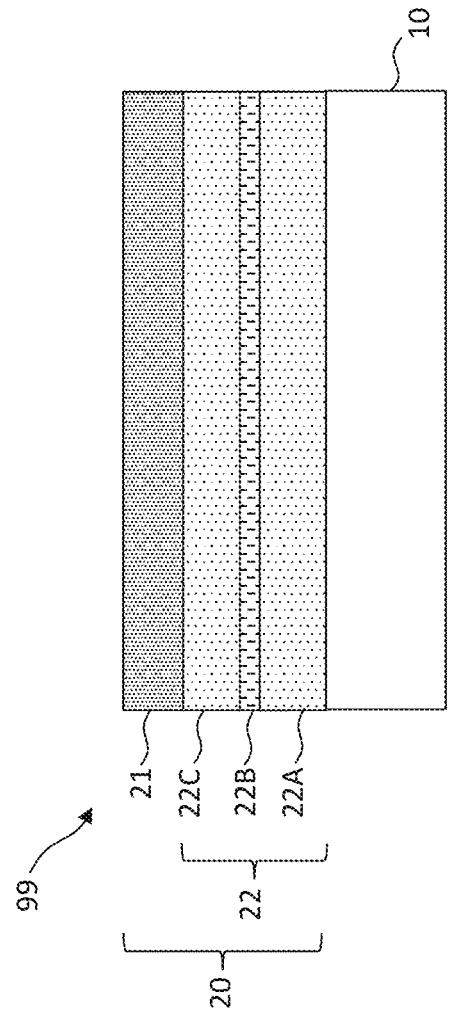

As shown in FIGS. 11A and 11B, according to some embodiments of the present disclosure, an electrical conductor 20 comprises a first layer 21 and a second layer 22. First layer 21 comprises a metallic conductor and second layer 22 comprises three sublayers, a first sublayer 22A, a second sublayer 22B, and a third sublayer 22C. First sublayer 22A comprises ITO disposed on first layer 21. Second sublayer 22B comprises chromium disposed on first sublayer 22A. Third sublayer 22C comprises ITO disposed on second sublayer 22B. The three sublayers 22A-22C can all be electrically conductive and the stack of sublayers in second layer 22 can conduct electrical current through the stack so that third sublayer 22C is electrically connected to first sublayer 22A and to first layer 21. According to some embodiments, the metallic conductor is aluminum. In some embodiments, electrical conductor 20 is disposed on or in a substrate 10, for example comprising glass or plastic, which forms at least a portion of an electrical conductor structure 99. As shown in FIG. 11A, first layer 21 can be disposed on substrate 10 or, as shown in FIG. 11B, second layer 22 can be disposed on substrate 10. When used in conjunction with micro-transfer-printed chiplets 40 having connection posts 44, connection posts 44 can pierce first sublayer 22A, first and second sublayers 22A, 22B, or first, second, and third sublayers 22A, 22B, 22C (or the reverse if third sublayer 22C is disposed on first layer 21).

According to some embodiments, first sublayer 22A and third sublayer 22C have substantially the same thickness (e.g., within 20% or within 15%). In some embodiments, first or third sublayers 22A, 22C are five to twenty times thicker than second sublayer 22B. For example, first and third sublayers 22A, 22C can be 40 nm thick and second sublayer 22B can be five nm thick. First layer 21 can be thicker than second layer 22 or thicker than first or third sublayers 22A, 22C, for example 100 nm or 50 nm thick. By providing first and second layers 21 and 22 and three sublayers 22A, 22B, 22C of second layer 22 with the indicated materials, an electrically conductive light trap can be formed that is suitable for use, for example in displays to improve the display contrast and also provide electrical conductors for control, power, and ground signals used in the display. Moreover, the structure is essentially planar, providing compatibility with conventional photolithographic processing and flat-panel displays.

According to some embodiments, electrical conductor 20 is an electrically conductive light trap that absorbs visible light. The light passes through third sublayer 22C (or first sublayer 22A in the inverted second layer 22 structure) and is reflected and/or refracted at the interfaces between second sublayer 22B and first and third sublayers 22A, 22B, and destructively interferes with itself and is substantially absorbed by second sublayer 22B, for example absorbing 50% or more of incident visible light, absorbing 60% or more of incident visible light, absorbing 70% or more of incident visible light, absorbing 80% or more of incident visible light, absorbing 90% or more of incident visible light, absorbing 95% or more of incident visible light, or absorbing 98% or more of incident visible light.

Component 40 can be an active component, for example including one or more active elements such as electronic transistors or diodes or light-emitting diodes and photodiodes that produce an electrical current in response to ambient light. Alternatively, component 40 can be a passive component, for example including one or more passive elements such as resistors, capacitors, or conductors. In some embodiments, component 40 is a compound component 40 that includes both active and passive elements. Component 40 can be a semiconductor device having a semiconductor substrate comprising one or more semiconductor layers, such as an integrated circuit 46. Component 40 can be an unpackaged die. In some embodiments, component 40 is a compound element having a plurality of active or passive elements, such as multiple semiconductor devices with separate substrates, each with one or more active elements or passive elements, or both. In certain embodiments, the plurality of elements is disposed and interconnected on a compound element substrate separate from the substrates of any semiconductor devices or a different substrate. In some embodiments, the compound element can be micro transfer printed itself after the elements have been arranged thereon. Components 40 can be electronic processors, controllers, drivers, light-emitting diodes, photodiodes, light-control devices, or light-management devices.

Components 40 made by methods of the present disclosure can include or be a variety of chiplets 40 having semiconductor structures or integrated circuits 46, including a diode, a light-emitting diode (LED), a transistor, or a laser. Chiplets 40 can be or comprise small integrated circuits 46 and can be unpackaged dies released from a source wafer and can be micro transfer printed. Chiplets 40 can have at least one of a width, length, and height from 2 to 50 µm (e.g., 2 to 5 µm, 5 to 10 µm, 10 to 20 µm, or 20 to 50 µm). Chiplets 40 can have a doped or undoped semiconductor substrate thickness of 2 to 50 μm (e.g., 2 to 5 μm, 5 to 10 μm, 10 to 20 μm, or 20 to 50 μm). The components 40 can be micro-light-emitting diodes with a length greater than width, for example having an aspect ratio greater than or equal to at least 2, 4, 8, 10, 20, or 50. Components 40 can include component contact pads 45 that are adjacent to the ends of the printable semiconductor components 40 along the length of the printable semiconductor components 40 to enable electrical connections to a circuit formed in component 40 using conventional photolithographic methods and materials. Such component contact pads 45 are typically formed from metals such as aluminum or polysilicon using masking and deposition processes used in the art and are electrically connected to component 40 with or without component wires. In some embodiments, component contact pads 45 are omitted and connection posts 44 are electrically connected to circuits formed in component 40 with wires.

Components 40 can be constructed on a component source wafer using conventional photolithographic processes found in electronic fabrication facilities, for example as described in U.S. Pat. Nos. 8,889,485 and 10,468,363. Components 40 can be made in a source semiconductor wafer (e.g., a silicon or GaN wafer) having a process side and a back side used to handle and transport the wafer. Components 40 are formed using lithographic processes in an active layer on or in the process side of the source wafer. An empty release layer space is formed beneath the components 40 with tethers connecting components 40 to the source wafer in such a way that pressure applied against the components 40 breaks or separates the tethers to release components 40 from the source wafer. Methods of forming such structures are described, for example, in the paper "AMOLED Displays using Transfer-Printed Integrated Circuits" and U.S. Pat. No. 8,889,485 referenced above.

In some embodiments, the components 40 can be or comprise small integrated circuits 46 formed in a semiconductor wafer, for example gallium arsenide or silicon, which can have a crystalline structure. Processing technologies for these materials typically employ high heat and reactive chemicals. However, by employing transfer technologies that do not stress the component 40 or substrate materials, more benign environmental conditions can be used compared to thin-film manufacturing processes. Thus, embodiments of the present disclosure have an advantage in that flexible substrates, such as polymeric substrates, that are intolerant of extreme processing conditions (e.g. heat, chemical, or mechanical processes) can be employed for target substrates 10. Furthermore, it has been demonstrated that crystalline silicon substrates have strong mechanical properties and, in small sizes, can be relatively flexible and tolerant of mechanical stress. This is particularly true for substrates having 5-micron, 10-micron, 20-micron, 50-micron, or even 100-micron thicknesses. Alternatively, the components 40 can be formed in a microcrystalline, polycrystalline, or amorphous semiconductor layer.

Substrate 10 can be any useful substrate on which bilayer electrical conductors 20 can be formed, for example substrates used for flat-panel displays, such as glass, or plastic, ceramic, sapphire, or semiconductor substrates such as silicon or compound semiconductors. First and second layers 21, 22 can be formed by depositing one or more layers of material, for example by evaporation or sputtering, and then masking the deposited layer(s) with photoresist patterned with an optical mask, pattern-wise etching the layers of material, and then stripping the photoresist, as is commonly done in integrated circuit processes.

In some embodiments, connection posts 44 are electrical connections formed on the process side of component 40 that extend generally perpendicular to the surface of the process side. Such connection posts 44 can be formed from metals such as aluminum, titanium, tungsten, copper, silver, gold, or other conductive metals. Connection posts 44 can be formed by repeated masking and deposition processes that build up three-dimensional structures. In some embodiments, connection posts 44 are made of one or more high elastic modulus metals, such as tungsten. As used herein, a high elastic modulus is an elastic modulus sufficient to maintain the function and structure of connection post 44 when pressed into a substrate contact pads 26. Such structures can also be made by forming a layer above component 40 surface, etching a well into the surface, filling it with a conductive material such as metal, and then removing the layer.

Connection posts 44 can have a variety of aspect ratios and typically have a peak area smaller than a base area. The connection posts 44 can have a sharp point for embedding in or piercing bilayer electrical conductor 20 substrate contact pads 26. Components 40 with protruding connection posts 44 are generally discussed in U.S. Pat. Nos. 8,889,485 and 10,468,363.

As shown in the Figures, connection posts 44 can have a base width representing a planar dimension of connection post 44 on the process side and a height representing the extent of connection post 44 from the process side to the peak of connection post 44. The peak of connection post 44 can have a width less than the base width that, in some embodiments, approaches zero so connection post 44 has a sharp point. Connection post 44 can also have a height greater than a base dimension.

An optional adhesive layer can be disposed on substrate 10 to adhere components 40 to substrate 10. Connection posts 44 can be driven through the adhesive layer to form an electrical connection with contact pads 26 beneath the adhesive layer. The adhesive layer can be cured to more firmly adhere components 40 to substrate 10 and maintain a robust electrical connection between connection posts 44 and contact pads 26 in the presence of mechanical stress. The adhesive layer can undergo some shrinkage during the curing process that can further strengthen the electrical connectivity and adhesion between component 40 and connection post 44 and substrate 10 and contact pads 26.

In some embodiments, optional solder materials are provided on contact pads 26 and are melted and reflowed to enhance an electrical connection between contact pads 26 and connection posts 44.

In some embodiments, connection posts 44 or contact pads 26, or both, are deformed or crumpled into a non-planar shape or are deformed so that the surfaces of the connection posts 44 and the contact pads 26 change shape on contact with each other. To facilitate deformation, in some embodiments, a connection post 44 can have a composition softer than that of contact pads 26 or the contact pads 26 have a composition softer than a connection post 44.

According to some embodiments of the present disclosure, a source wafer can be provided with components 40, component contact pads 45, connection posts 44, release layers, and tethers 42 already formed on the process side of the source wafer. Alternatively, an unprocessed source wafer can be provided and the components 40 formed on the process side of the source wafer. An unprocessed source wafer is a substrate that does not yet include components 40. The unprocessed source wafer can have other processing steps completed, for example, cleaning, deposition of material layers, or heat or chemical treatments, as are used in the photo-lithographic arts. Components 40 are formed, for example using photo-lithographic processes including forming masks over the source wafer, etching materials, removing masks, and depositing materials. Such processes are used in the photo-lithographic arts. Using such processes, components 40 are formed on or in the process side of the source wafer.

Embodiments of the present disclosure provide advantages over other printing methods described in the prior art. By employing connection posts 44 on components 40 and a printing method that provides components 40 on a target substrate 10 with the process side and connection posts 44 adjacent to the target substrate 10, a low-cost method for printing chiplets in large quantities over a target substrate 10 in an ambient atmosphere with good electrical connections is provided. Furthermore, additional process steps for electrically connecting the components 40 to the target substrate 10 are obviated.

The source wafer and components 40, stamp, transfer stamp 30, and target substrate 10 can be made separately and at different times or in different temporal orders or locations and provided in various process states.

As is understood by those skilled in the art, the terms "over" and "under" are relative terms and can be interchanged in reference to different orientations of the layers, elements, and substrates included in the present disclosure. For example, a first layer on a second layer, in some implementations means a first layer directly on and in contact with a second layer. In other implementations a first layer on a second layer includes a first layer and a second layer with another layer therebetween.

Having described certain implementations of embodiments, it will now become apparent to one of skill in the art that other implementations incorporating the concepts of the disclosure may be used. Therefore, the disclosure should not be limited to certain implementations, but rather should be limited only by the spirit and scope of the following claims.

Throughout the description, where apparatus and systems are described as having, including, or comprising specific components, or where processes and methods are described as having, including, or comprising specific steps, it is contemplated that, additionally, there are apparatus, and systems of the disclosure that consist essentially of, or consist of, the recited components, and that there are processes and methods according to the disclosure that consist essentially of, or consist of, the recited processing steps.

It should be understood that the order of steps or order for performing certain action is immaterial so long as operability is maintained. Moreover, two or more steps or actions in some circumstances can be conducted simultaneously. The disclosure has been described in detail with particular reference to certain embodiments thereof, but it will be understood that variations and modifications can be effected within the spirit and scope of the following claims.

PARTS LIST

A cross section line
B cross section line
T1 first time
T2 second time
10 substrate/target substrate/destination substrate
11 surface
20 bilayer electrical conductor
21 first layer
21X non-conductive layer
22 second layer
22A first sublayer
22B second sublayer
22C third sublayer
24 wire
26 contact pad/substrate contact pad
40 component/micro-component/chiplet
40A first component/integrated circuit
40B second component/integrated circuit
42 tether/broken or separated tether
44 connection post
45 component contact pad
46 integrated circuit
48 electrode
50 dielectric layer
99 bilayer electrical conductor structure
100 provide source wafer with components step
102 provide stamp step
104 provide substrate step
106 deposit and pattern first layer step
108 deposit and pattern second layer step
108A deposit and pattern first sublayer step
108B deposit and pattern second sublayer step
108C deposit and pattern third sublayer step
110 contact components with stamp step
120 align components to contact pads step
130 micro-transfer components to contact pads step
140 remove stamp step

The invention claimed is:

1. An electrical conductor structure, comprising:
a substrate;
an electrical conductor disposed on or in the substrate, wherein the electrical conductor comprises a first layer and a second, outermost layer disposed on a side of the first layer opposite the substrate, the first layer made of a first electrical conductor that forms a non-conductive layer on a surface of the first electrical conductor when exposed to air and the second layer made of a second electrical conductor that does not form a non-conductive layer on a surface of the second electrical conductor when exposed to air; and
a component comprising a connection post electrically connected to the second electrical conductor,
wherein the first electrical conductor is more electrically conductive than the second electrical conductor and wherein the second layer covers the first layer.

2. The electrical conductor structure of claim 1, wherein the first layer comprises a metal.

3. The electrical conductor structure of claim 2, wherein the second layer comprises an electrically conductive oxide.

4. The electrical conductor structure of claim 1, wherein the first layer has an electrical conductivity that is at least 5× an electrical conductivity of the second layer.

5. The electrical conductor structure of claim 1, wherein the connection post is physically in contact with only the second layer of the electrical conductor.

6. The electrical conductor structure of claim 1, wherein the connection post is physically in contact with both the second layer and the first layer of the electrical conductor.

7. The electrical conductor structure of claim 1, wherein the second layer is disposed directly on the first layer.

8. An electrical conductor structure, comprising:
a substrate;
an electrical conductor disposed on or in the substrate, wherein the electrical conductor comprises a first layer and a second, outermost layer disposed on a side of the first layer opposite the substrate, the first layer made of a metal and the second layer made of electrically conductive oxide; and a component electrically connected to the second layer, wherein the component comprises a connection post physically connected to the electrical conductor, wherein the first layer is more electrically conductive than the second layer.

9. The electrical conductor structure of claim 8, wherein the metal is selected from the group consisting of aluminum, silver, and copper, the metal having a purity of at least 90 atom %.

10. The electrical conductor structure of claim 9, wherein the electrically conductive oxide is an electrically conductive metal oxide selected from the group consisting of indium tin oxide (ITO), aluminum zinc oxide (AZO), and chromium oxide.

11. An electrical conductor structure, comprising:

a substrate;

an electrical conductor disposed on or in the substrate, wherein the electrical conductor comprises a first layer and a second, outermost layer disposed on a side of the first layer opposite the substrate, the first layer made of a first electrical conductor that forms a non-conductive layer on a surface of the first electrical conductor when exposed to air and the second layer made of a second electrical conductor that does not form a non-conductive layer on a surface of the second electrical conductor when exposed to air; and a component comprising a connection post electrically connected to the second electrical conductor, wherein the component comprises a broken or separated tether.

12. The electrical conductor structure of claim 11, wherein the connection post has a sharp point that physically contacts and extends into the second layer or that physically contacts and extends into the second layer and the first layer.

13. An electrical conductor structure, comprising:

a substrate;

an electrical conductor disposed on or in the substrate, wherein the electrical conductor comprises a first layer and a second, outermost layer disposed on a side of the first layer opposite the substrate, the first layer made of a first electrical conductor that forms a non-conductive layer on a surface of the first electrical conductor when exposed to air and the second layer made of a second electrical conductor that does not form a non-conductive layer on a surface of the second electrical conductor when exposed to air; and a component comprising a connection post electrically connected to the electrical conductor, wherein the second layer comprises multiple sublayers.

14. The electrical conductor structure of claim 13, wherein the second layer comprises a first sublayer of indium tin oxide (ITO), a second sublayer of chromium, black chromium oxide, or carbon black on the first sublayer, and a third sublayer of ITO on the second sublayer.

15. An electrical conductor structure, comprising:

a substrate;

an electrical conductor disposed on or in the substrate, wherein the electrical conductor comprises a first layer and a second, outermost layer disposed on a side of the first layer opposite the substrate, the first layer made of a first electrical conductor that forms a non-conductive layer on a surface of the first electrical conductor when exposed to air and the second layer made of a second electrical conductor that does not form a non-conductive layer on a surface of the second electrical conductor when exposed to air; and a component comprising a connection post electrically connected to the second electrical conductor, wherein the first electrical conductor is more electrically conductive than the second electrical conductor and wherein the connection post is physically in contact with only the second layer of the electrical conductor.

* * * * *